(12) United States Patent
Chiang

(10) Patent No.: US 10,580,718 B2
(45) Date of Patent: Mar. 3, 2020

(54) INTERCONNECT STRUCTURE HAVING SPACER DISPOSED ON SIDEWALL OF CONDUCTIVE LAYER, MANUFACTURING METHOD THEREOF, AND SEMICONDUCTOR STRUCTURE

(71) Applicant: Winbond Electronics Corp., Taichung (TW)

(72) Inventor: Ming-Chung Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/871,025

(22) Filed: Jan. 14, 2018

(65) Prior Publication Data
US 2018/0350722 A1    Dec. 6, 2018

(30) Foreign Application Priority Data
May 31, 2017    (CN) .......................... 2017 1 0397007

(51) Int. Cl.
*H01L 23/48* (2006.01)
*H01L 21/48* (2006.01)
(Continued)

(52) U.S. Cl.
CPC .......... *H01L 23/48* (2013.01); *H01L 21/4846* (2013.01); *H01L 23/522* (2013.01); *H01L 29/40* (2013.01); *B82Y 10/00* (2013.01); *B82Y 30/00* (2013.01); *B82Y 99/00* (2013.01); *H01L 2924/13091* (2013.01)

(58) Field of Classification Search
CPC ............... H01L 23/481; H01L 21/4846; H01L 29/0847; H01L 29/6656; H01L 21/28518; H01L 29/78; H01L 23/5226; H01L 29/4975; H01L 21/76802; H01L 21/76804; H01L 21/76877; H01L 21/76897

See application file for complete search history.

(56) References Cited

U.S. PATENT DOCUMENTS 6,150,266 A * 11/2000 Lin .................. H01L 21/76895
257/382
6,573,551 B1 * 6/2003 Kim .................. H01L 21/76897
257/306

(Continued)

FOREIGN PATENT DOCUMENTS

CN          1950946          4/2007
TW          512534           12/2002
(Continued)

OTHER PUBLICATIONS

"Office Action of Taiwan Counterpart Application", dated Jan. 2, 2019, p. 1-p. 6.

(Continued)

*Primary Examiner* — Khiem D Nguyen
(74) *Attorney, Agent, or Firm* — JCIPRNET

(57) ABSTRACT

An interconnect structure including a conductive layer, a spacer, a dielectric layer, and a contact is provided. The conductive layer is disposed on a substrate. The spacer is disposed on a sidewall of the conductive layer. The dielectric layer covers the conductive layer and the spacer. The contact is disposed in the dielectric layer and located on the conductive layer.

12 Claims, 9 Drawing Sheets

(51) Int. Cl.
    *H01L 29/40*           (2006.01)
    *H01L 23/522*        (2006.01)
    *B82Y 99/00*           (2011.01)
    *B82Y 30/00*           (2011.01)
    *B82Y 10/00*           (2011.01)

(56) References Cited

U.S. PATENT DOCUMENTS

| | | | | |
|---|---|---|---|---|
| 9,029,862 | B2* | 5/2015 | Nummy | H01L 21/4846 257/68 |
| 2002/0055222 | A1 | 5/2002 | Kim et al. | |
| 2002/0142555 | A1* | 10/2002 | Cha | H01L 21/76895 438/303 |
| 2002/0187598 | A1* | 12/2002 | Park | H01L 21/76801 438/197 |
| 2005/0245030 | A1* | 11/2005 | Ha | H01L 45/06 438/257 |
| 2005/0247926 | A1* | 11/2005 | Sun | H01L 21/823807 257/19 |
| 2006/0202341 | A1* | 9/2006 | Ito | H01L 21/76816 257/758 |
| 2006/0266992 | A1* | 11/2006 | Matsui | H01L 27/2436 257/4 |
| 2007/0099377 | A1* | 5/2007 | Happ | H01L 27/2436 438/257 |
| 2008/0011999 | A1* | 1/2008 | Choi | H01L 45/16 257/4 |
| 2008/0042243 | A1* | 2/2008 | Lee | H01L 27/2436 257/613 |
| 2008/0079089 | A1* | 4/2008 | Lee | H01L 29/66515 257/384 |
| 2008/0191187 | A1* | 8/2008 | Lung | G11C 13/0004 257/4 |
| 2010/0210087 | A1* | 8/2010 | Sung | H01L 21/76885 438/381 |
| 2010/0230765 | A1* | 9/2010 | Quek | H01L 21/26506 257/408 |
| 2012/0241882 | A1* | 9/2012 | Moon | H01L 43/12 257/421 |
| 2012/0306081 | A1* | 12/2012 | Ishizaki | H01L 21/764 257/751 |
| 2013/0078775 | A1* | 3/2013 | Liao | H01L 21/76897 438/261 |
| 2013/0313717 | A1 | 11/2013 | Holmes et al. | |
| 2015/0349093 | A1* | 12/2015 | Harley | H01L 29/66795 257/288 |
| 2016/0111430 | A1* | 4/2016 | Liaw | H01L 27/1104 |
| 2017/0025309 | A1* | 1/2017 | Ting | H01L 21/76837 |

FOREIGN PATENT DOCUMENTS

| | | |
|---|---|---|
| TW | 201606963 | 2/2016 |
| TW | 201709469 | 3/2017 |

OTHER PUBLICATIONS

"Office Action of China Counterpart Application," dated Sep. 4, 2019, p. 1-p. 14.

* cited by examiner

INTERCONNECT STRUCTURE HAVING SPACER DISPOSED ON SIDEWALL OF CONDUCTIVE LAYER, MANUFACTURING METHOD THEREOF, AND SEMICONDUCTOR STRUCTURE

CROSS-REFERENCE TO RELATED APPLICATION

This application claims the priority benefit of Chinese application serial no. 201710397007.5, filed on May 31, 2017. The entirety of the above-mentioned patent application is hereby incorporated by reference herein and made a part of this specification.

BACKGROUND OF THE INVENTION

Field of the Invention

The invention relates to an interconnect structure, a manufacturing method thereof, and a semiconductor structure, and more particularly, to an interconnect structure having better process window, a manufacturing method thereof, and a semiconductor structure.

Description of Related Art

In the current process of a semiconductor device, capacitance is increased by increasing the height of the capacitor structure in the memory cell region. However, when the height of the capacitor structure is increased, the difficulty of the process of the contact in the peripheral circuit region is increased.

Specifically, since the height of the capacitor structure is increased, the depth of the contact opening is also deeper. To ensure the contact opening can sufficiently expose the conductive layer below, etching time is increased to over-etch the dielectric layer.

As a result, in the etching process of forming the contact opening, when overlay shift occurs to the contact opening and the conductive layer, the location of the contact opening exceeds the range of the conductive layer, and therefore the dielectric layer adjacent to the conductive layer is etched in the etching process, thus causing damage to the circuit device below the contact opening, such that the reliability of the semiconductor device is reduced.

Currently, the method used by the industry to solve overlay shift mainly includes increasing the size of the conductive layer or forbidding the disposition of a circuit device below the location adjacent to the conductive layer in the circuit design. However, regardless of the method used, the chip size is increased.

SUMMARY OF THE INVENTION

The invention provides an interconnect structure and a manufacturing method thereof that can effectively increase overlay window without increasing device size.

The invention provides an interconnect structure including a conductive layer, a spacer, a dielectric layer, and a contact. The conductive layer is disposed on a substrate. The spacer is disposed on a sidewall of the conductive layer. The dielectric layer covers the conductive layer and the spacer. The contact is disposed in the dielectric layer and located on the conductive layer.

The invention provides a semiconductor structure including a semiconductor device and the interconnect structure. The interconnect structure is electrically connected to the semiconductor device.

The invention provides a manufacturing method of an interconnect structure including the following steps. A substrate is provided. A conductive layer is formed on the substrate. A spacer is formed on a sidewall of the conductive layer. A dielectric layer covering the conductive layer and the spacer is formed. A contact is formed in the dielectric layer. The contact is located on the conductive layer.

Based on the above, in the interconnect structure and the manufacturing method thereof provided by the invention, since the spacer is located on the sidewall of the conductive layer, overlay window can be effectively increased without increasing device size. As a result, in the etching process of forming the contact opening, even if overlay shift occurs to the contact opening and the conductive layer, the location of the contact opening is still in the range of the spacer and the conductive layer, and therefore damage to the circuit device below the contact opening does not occur, such that the reliability of the semiconductor device can be increased.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are cross sections of a manufacturing process of the interconnect structure of an embodiment of the invention.

Figure 1A:
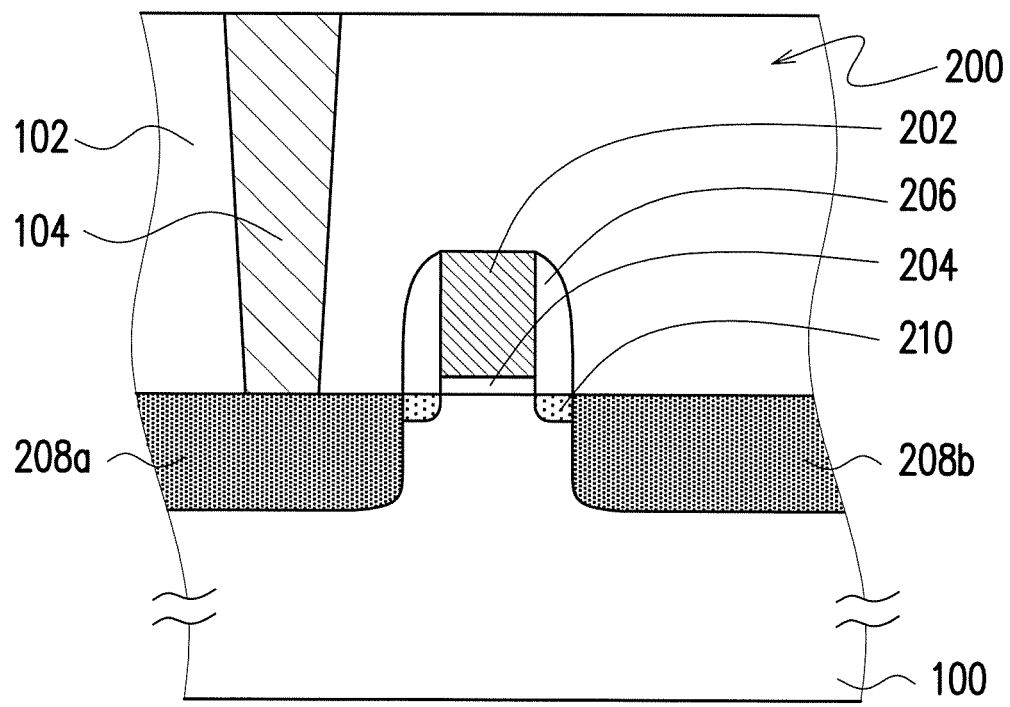
FIG. 1A to FIG. 1E are cross sections of a manufacturing process of the interconnect structure of an embodiment of the invention.

Referring to FIG. 1A, a substrate 100 is provided. A semiconductor device 200, a dielectric layer 102, and a contact 104 can be formed on the substrate 100. In the present embodiment, the semiconductor device 200 is exemplified by a MOS transistor, but the invention is not limited thereto.

The semiconductor device 200 includes a gate 202, a gate dielectric layer 204, a spacer 206, a doped region 208a, a doped region 208b, and a lightly-doped region 210. The gate 202 is disposed on the substrate 100. The gate dielectric layer 204 is disposed between the gate 202 and the substrate 100. The spacer 206 is disposed on a sidewall of the gate 202. The doped region 208a and the doped region 208b are disposed in the substrate 100 at two sides of the gate 202. The doped region 208a and the doped region 208b can respectively be used as the source or the drain. The lightly-doped region 210 is disposed in the substrate 100 below the spacer 206.

The dielectric layer 102 covers the semiconductor device 200. The material of the dielectric layer 102 is, for instance, silicon oxide. The forming method of the dielectric layer 102 is, for instance, a chemical vapor deposition method.

The contact 104 is disposed in the dielectric layer 102 and located on the doped region 208a, and therefore the contact 104 can be electrically connected to the doped region 208a. The material of the contact 104 is, for instance, tungsten. The forming method of the contact 104 is, for instance, a damascene method.

Figure 1B:
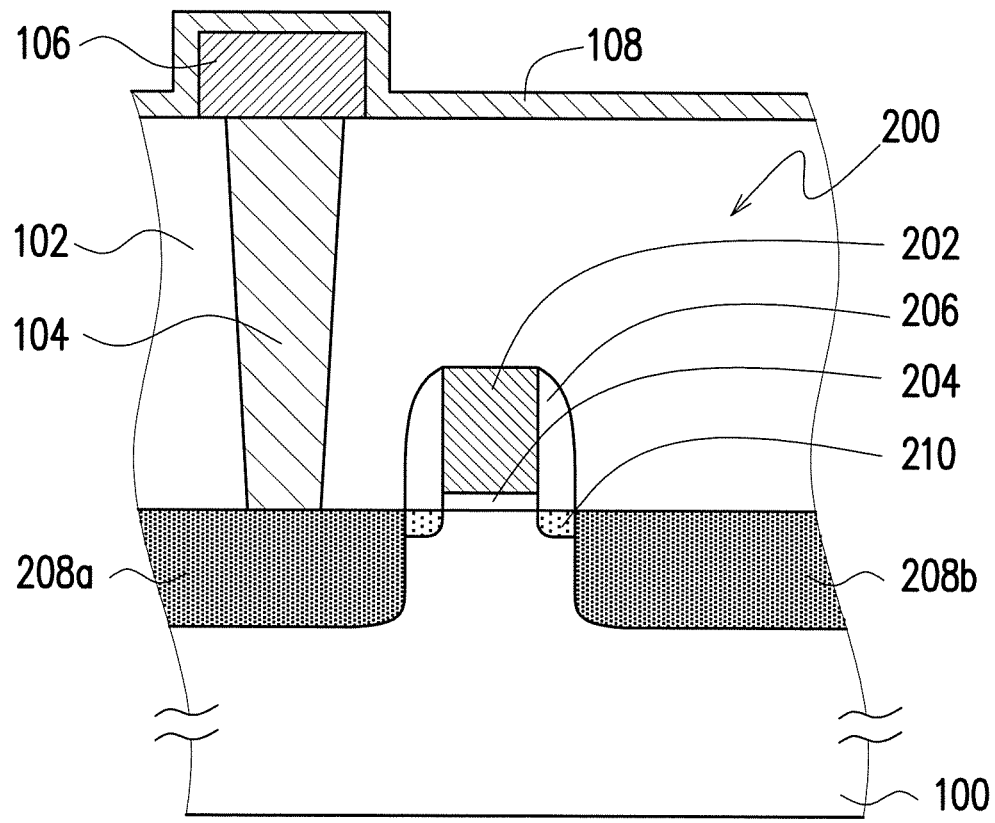

Referring to FIG. 1B, a conductive layer 106 is formed on the substrate 100. In the present embodiment, the conductive layer 106 is exemplified by being formed on the dielectric layer 102 above the substrate 100, but the invention is not limited thereto. Moreover, the conductive layer 106 can be electrically connected to the contact 104. Accordingly, the conductive layer 106 can be electrically connected to the electrode (the doped region 208a) of the semiconductor device 200 via the contact 104. The electrode of the semiconductor device 200 is, for instance, the source or the drain of the MOS transistor.

The material of the conductive layer 106 is, for instance, tungsten. The forming method of the conductive layer 106 includes, for instance, first forming a conductive material layer (not shown) on the dielectric layer 102, and then performing a patterning process on the conductive material layer.

A spacer material layer 108 is conformally formed on the conductive layer 106. The material of the spacer material layer 108 is, for instance, silicon nitride or polysilicon. The polysilicon is, for instance, doped polysilicon or undoped polysilicon. The forming method of the spacer material layer 108 is, for instance, a chemical vapor deposition method or an atomic layer deposition (ALD) method.

Figure 1C:
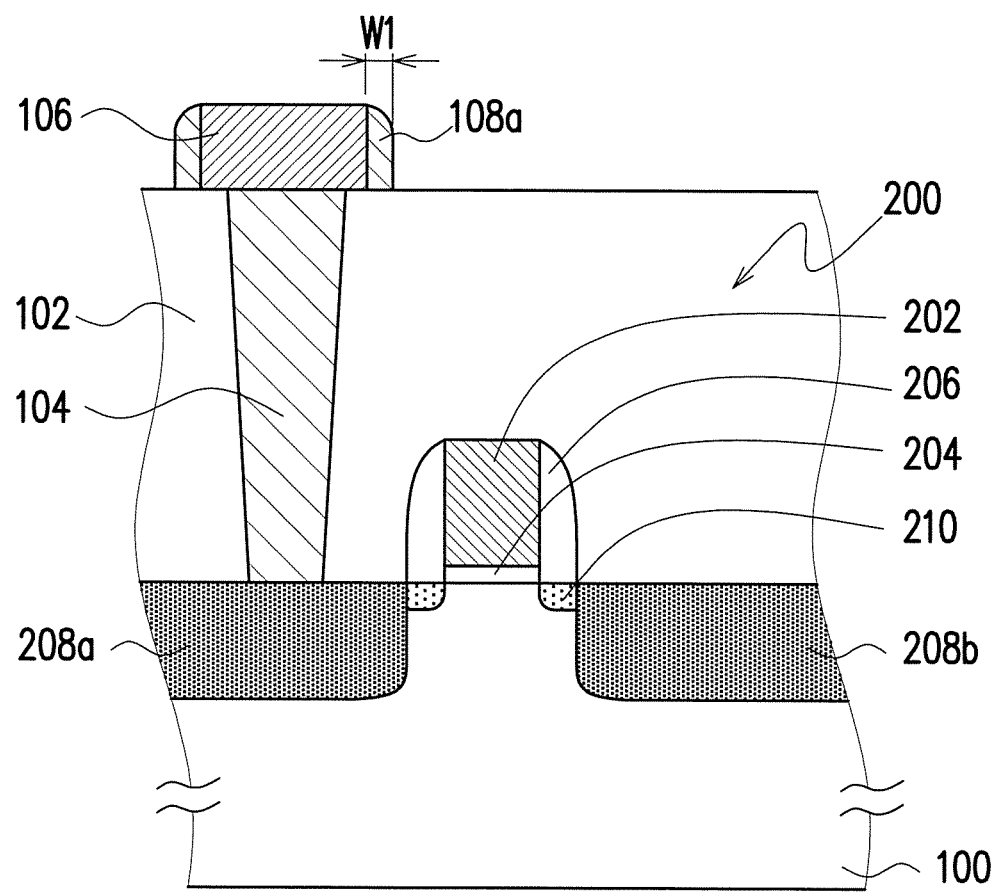

Referring to FIG. 1C, an etch-back process is performed on the spacer material layer 108 to form a spacer 108a on a sidewall of the conductive layer 106. A width W1 of the spacer 108a is, for instance, 5 nm to 15 nm. The etch-back process is, for instance, a dry etching process such as a reactive ion etching (RIE) process.

The spacer 108a can effectively increase the overlay window between the conductive layer 106 and a contact 114 (FIG. 1E) subsequently formed on the conductive layer 106. Moreover, when overlay shift occurs to the conductive layer 106 and the contact 114, a part of the contact 114 is located on the spacer 108a. When the material of the spacer 108a is polysilicon (in particular doped polysilicon having lower resistance), the contact part of the spacer 108a and the contact 114 can provide additional conductive area, and therefore the bottom contact resistance of the contact 114 can be reduced.

Figure 1D:
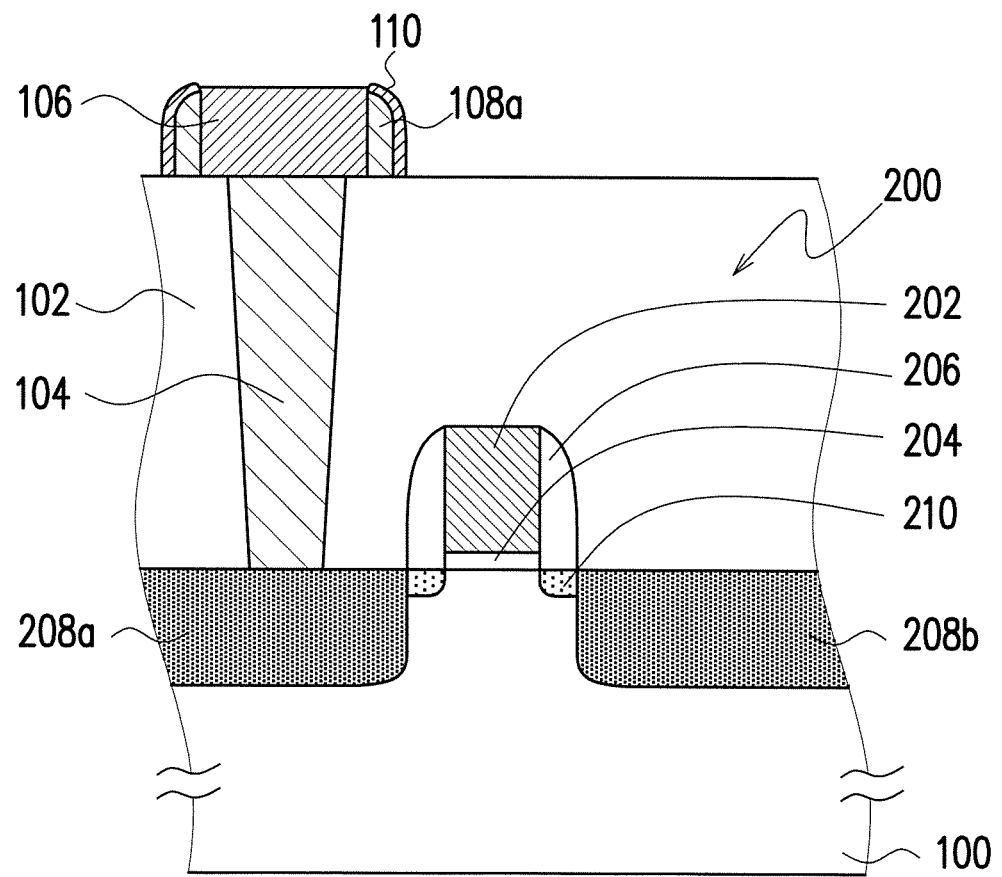

Referring to FIG. 1D, when the material of the spacer 108a is polysilicon, a metal silicide layer 110 can be optionally formed on the spacer 108a. Since the metal silicide layer 110 has lower resistance, the bottom contact resistance of the contact 114 (FIG. 1E) can be further reduced. The material of the silicide layer 110 is, for titanium silicide, cobalt silicide, or nickel silicide. The forming method of the metal silicide layer 110 is, for instance, performing a self-aligned metal silicide process.

Figure 1E:
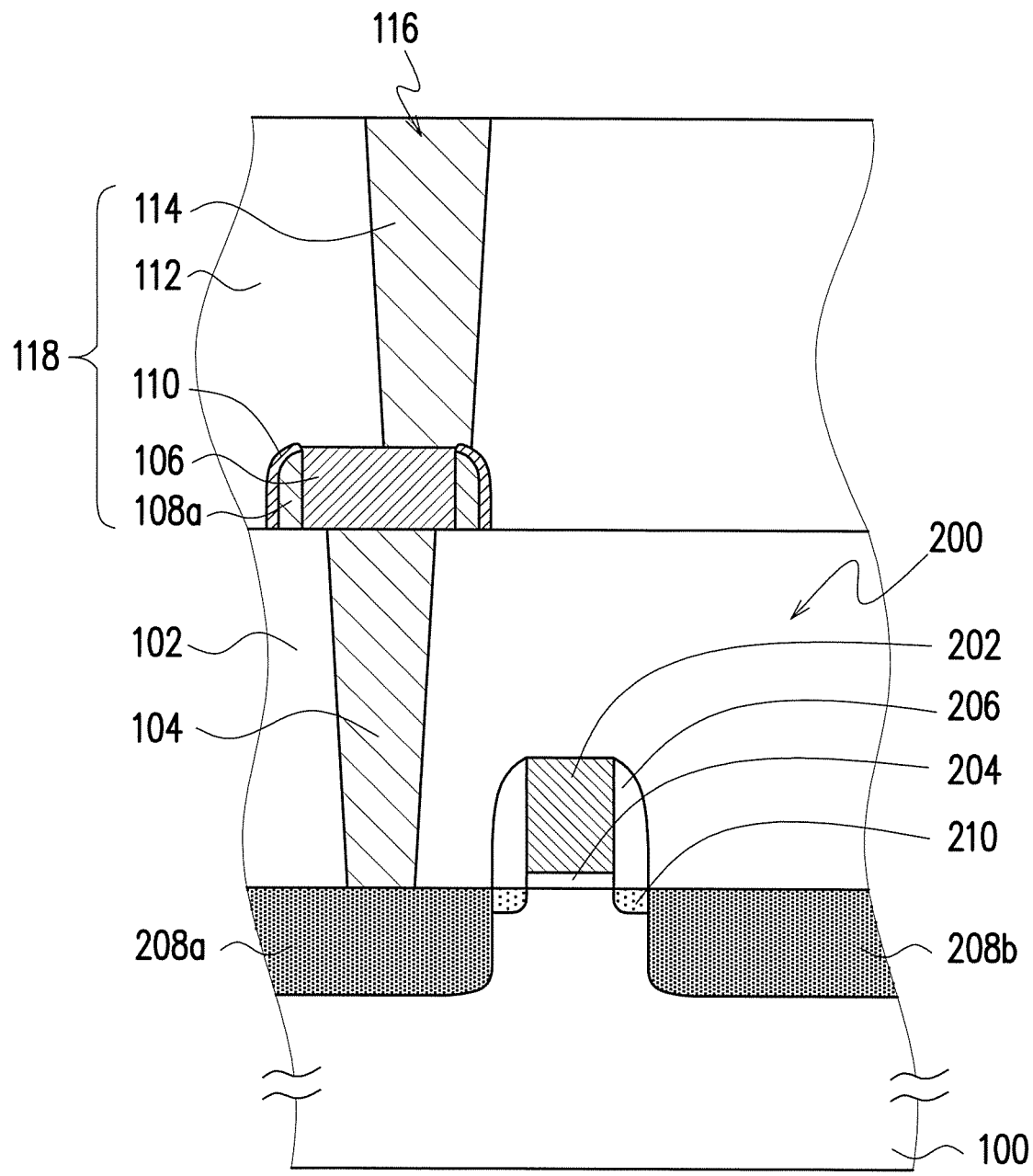

Referring to FIG. 1E, a dielectric layer 112 covering the conductive layer 106 and the spacer 108a is formed. The material of the dielectric layer 112 is, for instance, silicon oxide. The forming method of the dielectric layer 112 is, for instance, a chemical vapor deposition method.

The contact 114 is formed in the dielectric layer 112. The contact 114 is located on the conductive layer 106, and therefore the contact 114 can be electrically connected to the conductive layer 106. The material of the contact 114 is, for instance, tungsten. The forming method of the contact 114 is, for instance, a damascene method. Specifically, the forming method of the contact 114 can include first forming a contact opening 116 in the dielectric layer 112, then forming a contact material layer (not shown) filling up the contact opening 116, and then removing the contact material layer outside the contact opening 116. The forming method of the contact material layer is, for instance, a physical vapor deposition method. The removal method of the contact material layer outside the contact opening 116 is, for instance, a chemical mechanical polishing method.

In the following, an interconnect structure 118 of the above embodiments is described via FIG. 1E.

Referring to FIG. 1E, the interconnect structure 118 includes a conductive layer 106, a spacer 108a, a dielectric layer 112, and a contact 114. The conductive layer 106 is disposed on the substrate 100. The spacer 108a is disposed on a sidewall of the conductive layer 106. The dielectric layer 112 covers the conductive layer 106 and the spacer 108a. The contact 114 is disposed in the dielectric layer 112 and located on the conductive layer 106. Moreover, when the material of the spacer 108a is polysilicon, the interconnect structure 118 can further include a metal silicide layer 110. The metal silicide layer 110 is disposed on the spacer 108a. Moreover, the material, properties, forming method, and disposition of each component of the interconnect structure 118 are described in detail in the embodiments above and are not repeated herein.

In the present embodiment, the interconnect structure 118 is exemplified by including a metal silicide layer 110. However, in other embodiments, the interconnect structure 118 can also not include the metal silicide layer 110.

Moreover, the interconnect structure 118 can be applied in a semiconductor structure. For instance, the semiconductor structure can include a semiconductor device 200 and the interconnect structure 118, and the interconnect structure 118 is electrically connected to the semiconductor device 200. Specifically, the conductive layer 106 in the interconnect structure 118 can be electrically connected to the electrode (the doped region 208a) of the semiconductor device 200 via the contact 104. The electrode of the semiconductor device 200 is, for instance, the source or the drain of a MOS transistor.

Figure 2:
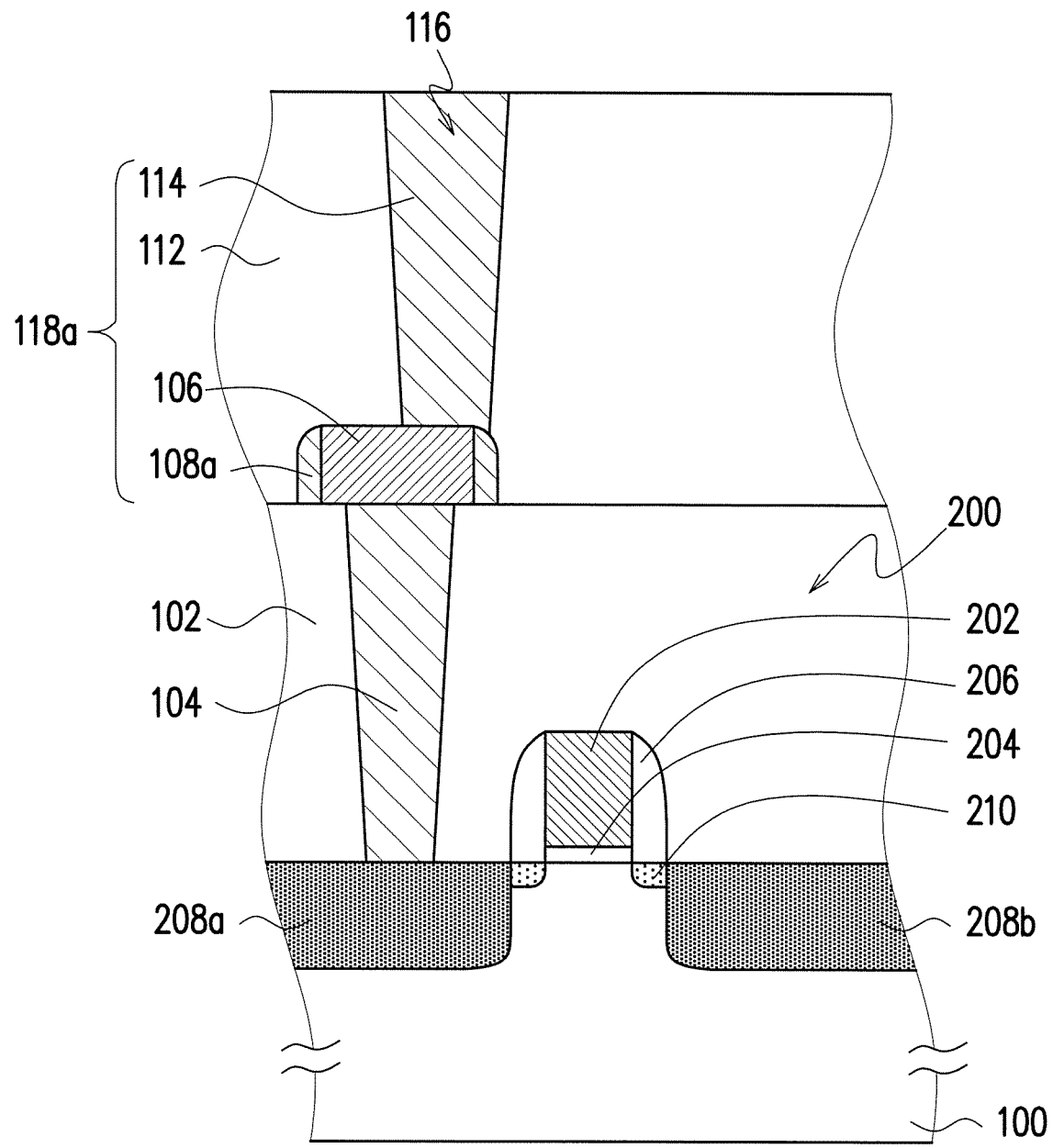
FIG. 2 is a cross section of the interconnect structure of another embodiment of the invention.

FIG. 2 is a cross section of the interconnect structure of another embodiment of the invention.

Referring to both FIG. 1E and FIG. 2, the difference between an interconnect structure 118a of FIG. 2 and the interconnect structure 118 of FIG. 1E is as follows. The interconnect structure 118a of FIG. 2 may not include the metal silicide layer 110 in the interconnect structure 118 of FIG. 1E. That is, in the process of forming the interconnect structure 118a of FIG. 2, the metal silicide layer 110 may not be formed on the spacer 108a. Moreover, similar components in the interconnect structure 118a of FIG. 2 and the interconnect structure 118 of FIG. 1E are represented by the same reference numerals and are not repeated herein.

It can be known from the above embodiments that, in the interconnect structures 118 and 118a and the manufacturing method thereof, since the spacer 108a is located on the sidewall of the conductive layer 106, overlay window can be effectively increased without increasing device size. As a result, in the etching process of forming the contact opening 116, even if overlay shift occurs to the contact opening 116 and the conductive layer 106, the location of the contact opening 116 is still in the range of the spacer 108a and the conductive layer 106, and therefore damage to the circuit device below the contact opening 116 does not occur, such that the reliability of the semiconductor device can be increased.

Figure 3A:
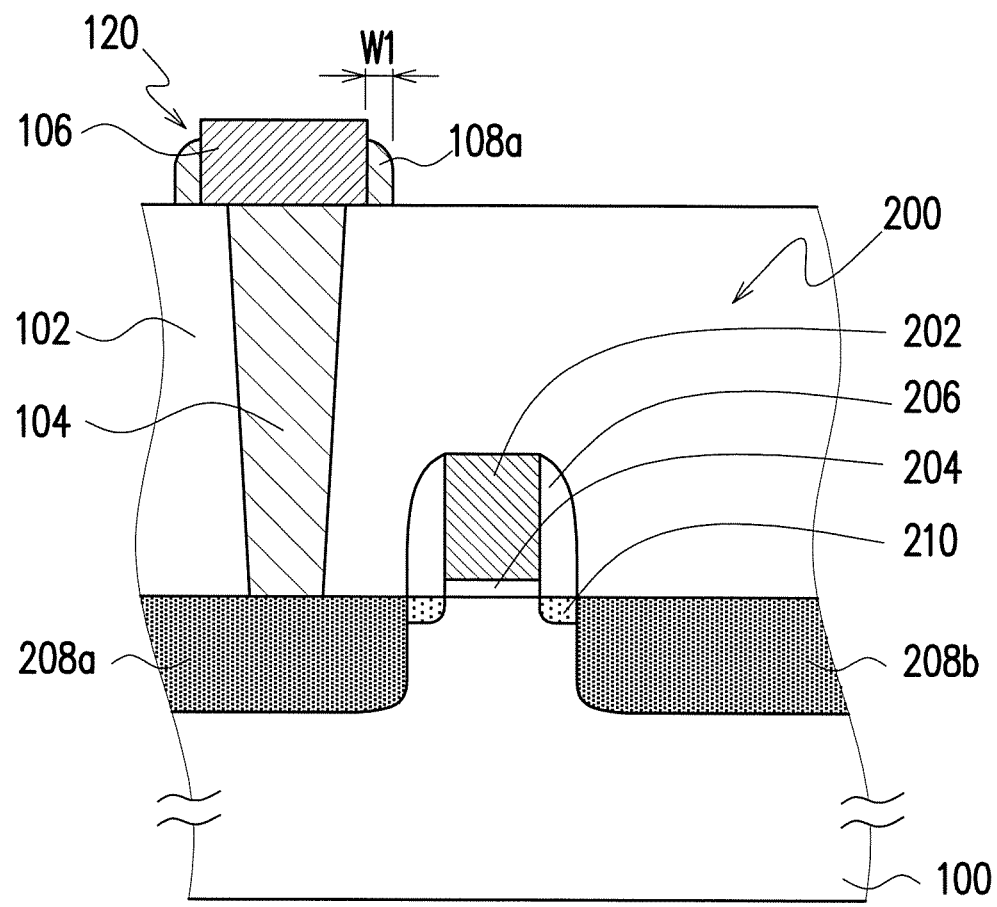
FIG. 3A to FIG. 3B are cross sections of a manufacturing process of the interconnect structure of another embodiment of the invention.
Figure 3B:
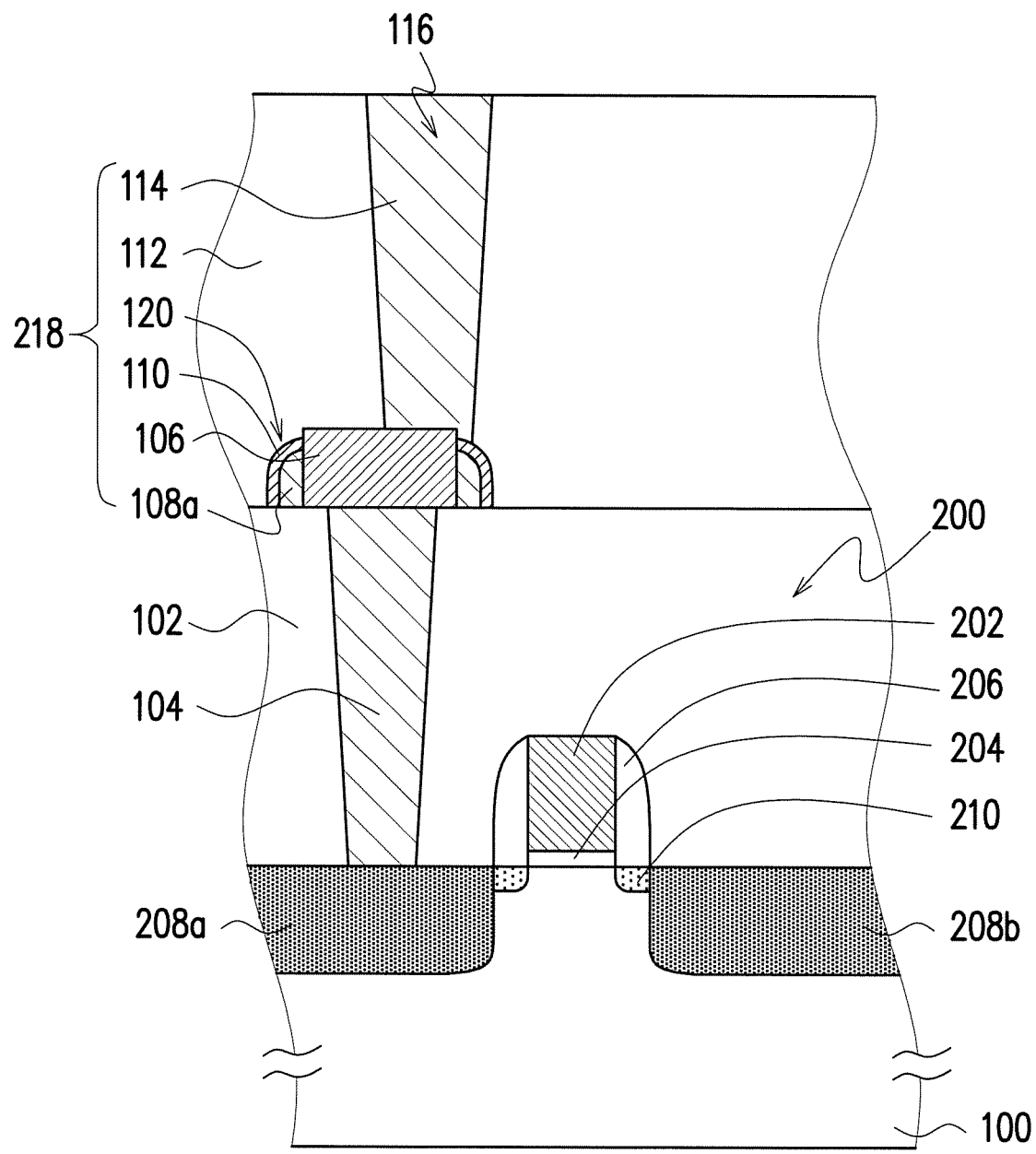

FIG. 3A to FIG. 3B are cross sections of a manufacturing process of the interconnect structure of another embodiment of the invention. FIG. 3A is a cross section of a subsequent manufacturing process of the interconnect structure of FIG. 1C.

Referring to FIG. 3A, after the etch-back process is performed on the spacer material layer 108 and the spacer 108a is formed on the sidewall of the conductive layer 106, an over-etching process is performed on the spacer 108a such that the top surface of the spacer 108a is lower than the top surface of the conductive layer 106 and a recess 120 is formed between the spacer 108a and the conductive layer 106. The over-etching process is, for instance, a dry etching process such as an RIE process.

Referring to FIG. 3B, when the material of the spacer 108a is polysilicon, a metal silicide layer 110 can be optionally formed on the spacer 108a. A dielectric layer 112 covering the conductive layer 106 and the spacer 108a is formed. A contact 114 is formed in the dielectric layer 112. The contact 114 is located on the conductive layer 106, and therefore the contact 114 can be electrically connected to the conductive layer 106. The forming method of the metal silicide layer 110, the dielectric layer 112, and the contact 114 is as provided for FIG. 1D to FIG. 1E and is not repeated herein.

In the following, an interconnect structure 218 of the above embodiments is described via FIG. 3B.

Referring to both FIG. 1E and FIG. 3B, the difference between the interconnect structure 118 of FIG. 1E and the interconnect structure 218 of FIG. 3B is as follows. In the interconnect structure 218 of FIG. 3B, the top surface of the spacer 108a is lower than the top surface of the conductive layer 106, and a recess 120 is formed between the spacer 108a and the conductive layer 106. Moreover, similar components in the interconnect structure 218 of FIG. 3B and the interconnect structure 118 of FIG. 1E are represented by the same reference numerals and are not repeated herein.

In the present embodiment, the interconnect structure 218 is exemplified by including the metal silicide layer 110. However, in other embodiments, the interconnect structure 218 can also not include the metal silicide layer 110.

Figure 4:
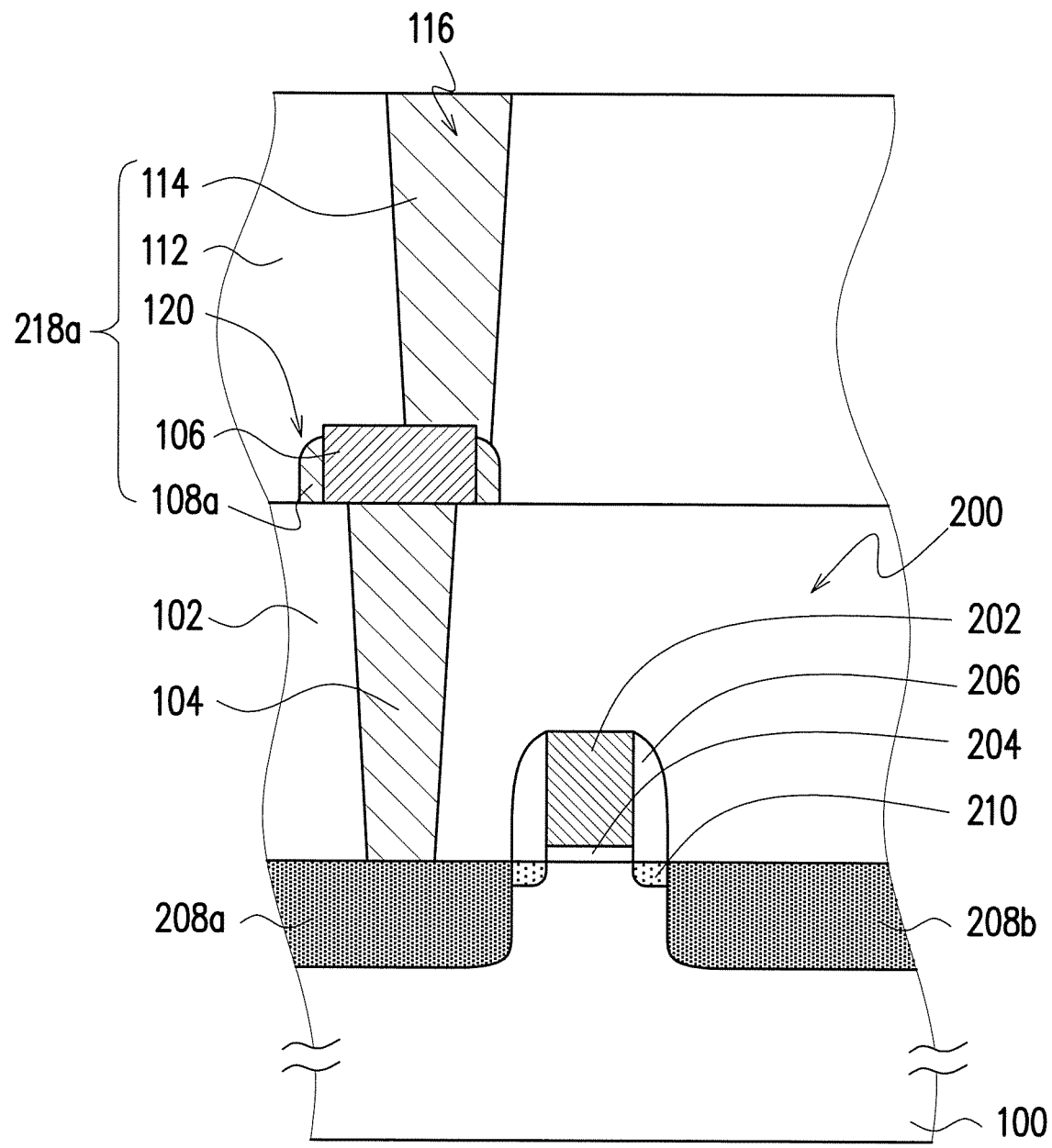
FIG. 4 is a cross section of the interconnect structure of another embodiment of the invention.

FIG. 4 is a cross section of the interconnect structure of another embodiment of the invention.

Referring to both FIG. 3B and FIG. 4, the difference between an interconnect structure 218a of FIG. 4 and the interconnect structure 218 of FIG. 3B is as follows. The interconnect structure 218a of FIG. 4 may not include the metal silicide layer 110 in the interconnect structure 218 of FIG. 3B. That is, in the process of forming the interconnect structure 218a of FIG. 4, the metal silicide layer 110 may not be formed on the spacer 108a. Moreover, similar components in the interconnect structure 218a of FIG. 4 and the interconnect structure 218 of FIG. 3B are represented by the same reference numerals and are not repeated herein.

It can be known from the embodiments that, in the interconnect structures 218 and 218a, since the recess 120 can expose the sidewall of a part of the conductive layer 106, when overlay shift occurs to the conductive layer 106 and the contact 114, the contact 114 is in contact with the sidewall of the conductive layer 106, and therefore the contact area of the conductive layer 106 and the contact 114 can be increased, such that the bottom contact resistance of the contact 114 can be further reduced.

Based on the above, in the interconnect structure and the manufacturing method thereof provided in the embodiments, since the spacer is located on the sidewall of the conductive layer, overlay window can be effectively increased without increasing device size. As a result, in the etching process of forming the contact opening, even if overlay shift occurs to the contact opening and the conductive layer, the location of the contact opening is still in the range of the spacer and the conductive layer, and therefore damage to the circuit device below the contact opening does not occur, such that the reliability of the semiconductor device can be increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An interconnect structure, comprising:
a first dielectric layer disposed on a substrate;
a first contact vertically penetrating the first dielectric layer;
a conductive layer disposed on the substrate, wherein the first contact is connected to a bottom surface of the conductive layer;
a spacer laterally surrounding the conductive layer, and vertically extending along a sidewall of the conductive layer from a top surface of the first dielectric layer toward a top surface of the conductive layer, wherein the spacer is in direct contact with the top surface of the first dielectric layer;
a second dielectric layer covering the conductive layer and the spacer, and in physical contact with the top surface of the conductive layer; and
a second contact disposed in the second dielectric layer and located on the conductive layer, wherein the second contact is physically connected to the top surface of the conductive layer, and the first contact and the second contact are separated from each other.

2. The interconnect structure of claim 1, wherein the first contact and the second contact are electrically connected to the conductive layer.

3. The interconnect structure of claim 1, wherein a width of the spacer is 5 nm to 15 nm.

4. The interconnect structure of claim 1, wherein a top surface of the spacer is lower than a top surface of the conductive layer, and a recess is formed between the spacer and the conductive layer.

5. The interconnect structure of claim 1, wherein a material of the spacer comprises a silicon nitride or a polysilicon, and the polysilicon comprises a doped polysilicon or an undoped polysilicon.

6. The interconnect structure of claim 5, wherein when the material of the spacer is the polysilicon, the interconnect structure further comprises:
a metal silicide layer disposed on the spacer.

7. A semiconductor structure, comprising a semiconductor device and the interconnect structure of claim 1, wherein the interconnect structure and the semiconductor device are electrically connected.

8. The semiconductor structure of claim 7, wherein the conductive layer of the interconnect structure is electrically connected to an electrode of the semiconductor device, and the electrode comprises a source or a drain of a MOS transistor.

9. A manufacturing method of an interconnect structure, comprising:
providing a substrate;
forming a first dielectric layer on the substrate;
forming a first contact in the first dielectric layer;
forming a conductive layer on the substrate, wherein the first contact is connected to a bottom surface of the conductive layer;
forming a spacer on a sidewall of the conductive layer, wherein the conductive layer is laterally surrounded by the spacer, the spacer vertically extends along the sidewall of the conductive layer from a top surface of the first dielectric layer toward a top surface of the conductive layer, and the spacer is in direct contact with the top surface of the first dielectric layer;
forming a second dielectric layer covering the conductive layer and the spacer, wherein the second dielectric layer is in physical contact with the top surface of the conductive layer; and
forming a second contact in the second dielectric layer, wherein the second contact is located on the conductive layer, the second contact is physically connected to the top surface of the conductive layer, and the first contact and the second contact are separated from each other.

10. The manufacturing method of the interconnect structure of claim 9, wherein a forming method of the spacer comprises:
conformally forming a spacer material layer on the conductive layer; and
performing an etch-back process on the spacer material layer.

11. The manufacturing method of the interconnect structure of claim 10, further comprising performing an over-etching process on the spacer after the etch-back process is performed on the spacer material layer such that a top surface of the spacer is lower than a top surface of the conductive layer and a recess is formed between the spacer and the conductive layer.

12. The manufacturing method of the interconnect structure of claim 9, further comprising forming a metal silicide layer on the spacer when a material of the spacer is a polysilicon.

* * * * *